(12) United States Patent
Fang

(10) Patent No.: US 8,148,628 B2
(45) Date of Patent: Apr. 3, 2012

(54) SOLAR CELL RECEIVER FOR CONCENTRATOR MODULES

(75) Inventor: Lu Fang, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 618 days.

(21) Appl. No.: 11/830,576

(22) Filed: Jul. 30, 2007

(65) Prior Publication Data

US 2009/0032092 A1 Feb. 5, 2009

(51) Int. Cl.
*H01L 31/042* (2006.01)
(52) U.S. Cl. .................................. 136/255; 136/256
(58) Field of Classification Search ........... 136/243–265
See application file for complete search history.

(56) References Cited

U.S. PATENT DOCUMENTS

| | | | |
|---|---|---|---|
| 4,188,238 A * | 2/1980 | Boling | 136/247 |
| 4,231,808 A | 11/1980 | Tabei et al. | |
| 4,460,232 A * | 7/1984 | Sotolongo | 439/535 |
| 5,951,785 A * | 9/1999 | Uchihashi et al. | 136/251 |
| 6,020,555 A | 2/2000 | Garboushian et al. | |
| 6,331,670 B2 | 12/2001 | Takehara et al. | |
| 6,344,612 B1 * | 2/2002 | Kuwahara et al. | 174/50 |
| 6,610,919 B2 * | 8/2003 | Ohkubo | 136/244 |
| 7,071,407 B2 * | 7/2006 | Faterni et al. | 136/262 |
| 7,671,270 B2 | 3/2010 | Fang | |
| 2004/0045598 A1 | 3/2004 | Narayanan et al. | |
| 2009/0032093 A1 * | 2/2009 | Fang | 136/255 |
| 2009/0199890 A1 | 8/2009 | Hering et al. | |
| 2009/0199891 A1 | 8/2009 | Hering et al. | |

FOREIGN PATENT DOCUMENTS

| JP | 2001168368 A | 6/2001 |
|---|---|---|
| JP | 2004-342986 | 12/2004 |

OTHER PUBLICATIONS http://en.wikipedia.org/wiki/Photovoltaic_module.*
Definition of connector, http://dictionary.reference.com/browse/connector, date unknown.*
The Potential of III-V Semiconductors as Terrestrial Photovoltaic Devices, M. Bosi and C. Pelosi, Prog. Photovolt: Res. Appl. 2007; 15:51-68, Copyright 2006.
First Demonstration of Multi-Junction Receivers in a Grid-Connected Concentrator Module; Raed A. Sherif et al., 31$^{st}$ IEEE PV Spec. Con., Jan. 3-7, 2005, pp. 635-638.
Outdoor Operation of GaInP/GaAs/Ge Triple Junction Concentrator Solar Cells Up to 1000 Suns; H. Cotal et al, 3$^{rd}$ World Conf on Photovoltaic Energy Conversion May 11-18, 2003 Osaka, Japan; pp. 825-828.

(Continued)

*Primary Examiner* — Jessica L Ward
*Assistant Examiner* — Kevin E Yoon

(57) ABSTRACT

A solar cell receiver comprising a III-V compound semiconductor solar cell and a diode mounted on a board including a connector for electrically connecting to adjacent receivers. The diode is connected in parallel with the solar cell, for reverse biasing the diode against conductivity during operation of the solar cell in generating solar energy, and the diode is operative to provide a current bypassing the solar cell when the solar cell is damaged or shadowed. The diode has a pair of electrical connector terminals for electrical connection to the solar cell. The connector includes a first receiving section adapted for receiving a first electrical conductor to connect the receiver to adjacent receivers.

21 Claims, 2 Drawing Sheets

OTHER PUBLICATIONS

Operation of 350 KW of Amonix High Concentration PV Systems At Arizona Public Service; 2003 ISEC Hawaii, USA Mar. 15-18, 2003; Kenneth W. Stone et al., pp. 1-6.

High Efficiency Solar Cells for Concentrator Systems: Silicon or Multi-Junction: Alexander Slade et al., SPIE Optics and Photonics, San Diego, Aug. 2005; 8 pgs.

A Novel High-Concentration PV Technology for Cost Competitive Utility Bulk Power Generation; Proc. 1 World Conf. on Photovoltaic Energy Conversion (1994); Vahan Garboushian et al. pp. 1060-1063.

Design & Performance of The Amonix High Concentration Solar PV System; SAES/ASME Natl. Solar Energy Conf. Reno, NV 2002; Kenneth W. Stone et al., 7 pgs.

Machine Translation of JP2001168368. Japan Patent Office. 23 pages.

Sharps, P.R., et al., "Emcore Photovoltaics: Modeling and Testing of Multi-junction Solar Cell Reliability." Space Power Workshop 2003, Apr. 21-24, 2003. Redondo Beach, CA. pp. 1-20.

Geisz, J.F., et al., "Toward a monolithic lattice-matched III-V on silicon tandem solar cell." 19th European PV Solar Energy Conference and Exhibit, Paris, France, Jun. 7-11, 2004. NREL, Golden, CO. Sep. 2004.

Stan, M.A., et al.,"InGaP/InGaAs/Ge High Concentration Solar Cell Development at Emcore." Conf. Record of the 31st IEEE Photovoltaic Specialists Conference, 2005. pp. 770-773. IEEE, Piscataway, NJ.

Aiken, D.J., et al., "Consideration of High Bandgap Subcells for Advanced Multijunction Solar Cells." Conf. record of the 2006 IEEE 4th World Conference on Photovoltaic Energy Conversion, 2006. pp. 838-841, IEEE, Piscataway, NJ.

Aiken, D.J., et al., "A Loss Analysis for a 28% Efficient 520X Concentrator Module." Conf. record of the 2006 IEEE 4th World Conference on Photovoltaic Energy Conversion, 2006. pp. 686-689. IEEE, Piscataway, NJ.

Aiken, D.J., et al., "Delivering Known Good Die: High Volume Testing of Multijunction Solar Cells for Use in Terrestrial Concentrator Systems." pp. 1-4.

U.S. Appl. No. 12/703,561 for "Solar Cell Receiver Having an Insulated Bypass Diode." Lu Fang. Filed Feb. 10, 2010. 24 pages.

Office action in U.S. Appl. No. 12/703,561 (dated Mar. 31, 2011).

* cited by examiner

SOLAR CELL RECEIVER FOR CONCENTRATOR MODULES

BACKGROUND OF THE INVENTION

1. Field of the Invention

This invention relates to a solar cell receiver for generating electricity from solar energy, and in particular to a receiver having an insulated diode for protecting against loss of power when its solar cell is damaged or shadowed.

2. Description of the Related Art

Solar cells are used to convert radiant energy into electricity, and can be operated at a relatively low cost as the energy generated is received from the sun.

Typically, a plurality of solar cells are disposed in an array or panel, and a solar energy system typically includes a plurality of such panels. The solar cells in each panel are usually connected in series, and the panels in a given system are also connected in series, typically each panel has numerous solar cells. The solar cells in each panel could, alternatively, be arranged in parallel.

A known problem with systems of this type is that individual solar cells can become damaged or shadowed by an obstruction. For example, damage can occur as a result of exposure of a solar cell to harsh environmental conditions. The current-carrying capacity of a panel having one or more damaged or shadowed solar cells is reduced, and the output from other panels in series with that panel reverse bias the damaged or shadowed cells. The voltage across the damaged or shadowed cells thus increases in a reverse polarity until the full output voltage of all of the panels in the series is applied to the damaged or shadowed cells in the panel concerned. This causes the damaged or shadowed cells to breakdown.

As a typical solar cell system has thousands of solar cells, its voltage output is normally in the hundreds volt range, and its current output is in the tens ampere range.

At these output power levels, if the solar cell terminals are not protected, uncontrollable electric discharge in the form of sparks tends to occur, and this can cause damage to the solar cells concerned and to the entire system.

U.S. Pat. No. 6,020,555 describes a solar cell system constituted by a plurality of panels, each of which includes a plurality of solar cells, each solar cell being provided with a diode connected between its positive and negative terminals. The provision of the diodes, typically Schottky bypass diodes, does go some way to protecting the solar cells against the uncontrollable electric discharges mentioned above. Unfortunately, however, the air gap left between the terminals of each of the diodes does not eliminate risks of sparking and shorting, which can still occur if moisture or foreign particles bridge the air gap of such a diode. Thus, although air is a dielectric medium, it has a low dielectric strength, which means that, when an electric field across an air gap reaches around 3 mv/m, electric current can jump across the air gap and discharge in the form of sparks. This is referred to as dielectric medium breakdown.

Another disadvantage of known solar cell receivers is that, owing to the need for such a receiver to generate 10 watts of power at 1000 volts for an extended period of up to, or exceeding, twenty years, there is a danger of sparking at the electrical terminals which connect one receiver of a solar cell system to adjacent receivers.

SUMMARY OF THE INVENTION

The present invention provides a solar cell receiver comprising a solar cell and a diode mounted on a board, the receiver being provided with a connector for electrically connecting to adjacent receivers, the diode being connected in parallel with the solar cell for reverse biasing the diode against conductivity during operation of the solar cell in generating solar energy, and the diode being operative to provide a current bypassing the solar cell when the solar cell is damaged or shadowed. The connector includes a first receiving section adapted for receiving a first electrical conductor to connect to adjacent receivers.

Preferably, the connector includes a socket with a receiving section and the first electrical conductor is adapted for insertion in the socket for electrically connecting the receiver to the adjacent receivers.

Some implementations or embodiments may incorporate or implement fewer of the aspects or features noted in the foregoing summaries.

BRIEF DESCRIPTION OF THE DRAWINGS

The invention will now be described in greater detail, by way of example, with reference to the drawings, in which.

DETAILED DESCRIPTION OF THE INVENTION

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
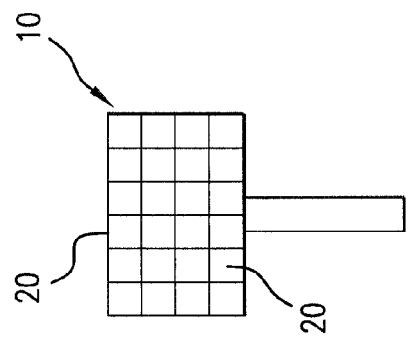
FIG. 1 is a perspective of a solar panel including apparatus for generating electricity from solar energy, the apparatus being constructed in accordance with one embodiment of the invention.

Referring to the drawings, FIG. 1 shows a solar panel 10, for generating electricity from solar energy. The panel 10 includes a plurality (24) of solar cell modules 20. Typically, it will be appreciated that a plurality of similar panels 10 can be provided to provide a solar energy generating system of greater capacity. Where a plurality of panels 10 are provided, these can be connected either in series or in parallel.

Figure 2:
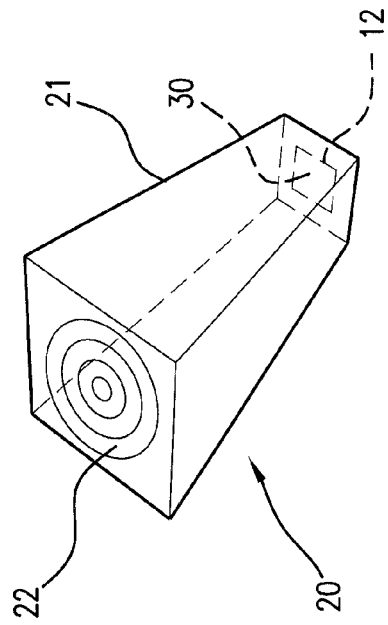
FIG. 2 is a perspective view of one solar cell module of the panel of FIG. 1.

As shown in FIG. 2, each solar cell module 20 is constituted by a lens 22 and a receiver 12 positioned at opposite ends of a trapezoidal housing 21. The receivers 12 of the solar cell modules 20 are electrically connected together in series as is described below.

Figure 4:
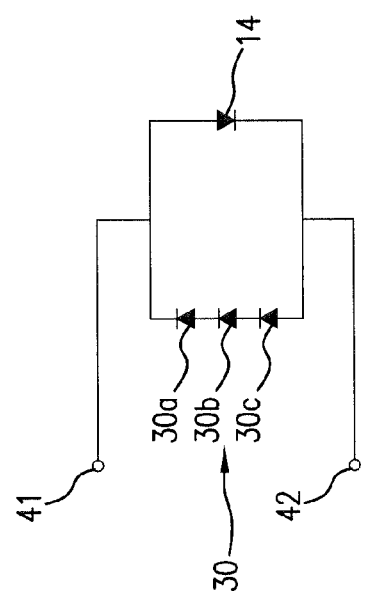
FIG. 4 is a circuit diagram of the solar cell board of FIG. 3.

FIG. 4 shows the circuit diagram of the receiver 12 of one of the solar cell modules 20. The receiver 12 is constituted by a triple-junction III-V compound semiconductor solar cell 30 constituted by a top cell 30a, a mid cell 30b and a bottom cell 30c arranged in series. The solar cell 30 is positioned to receive focused solar energy from the lens 22. The solar cell module 20 is such that sunlight incident upon the lens 22 is concentrated by a factor of at least 100 onto the solar cell 30. External connection terminals 43 and 44 are provided for connecting the solar cell 30 to adjacent receivers 12. A diode 14 is connected in parallel with the triple-junction solar cell 30. The diode 14 can be a semiconductor device such as a Schottky bypass diode. The solar cell 30, the diode 14 and the terminals 43 and 44 are mounted on a board 9 which may be made of insulating material, so that the diode is disposed on the board in an electrically-insulated relationship to the triple-junction solar cell. A connector 40 formed with receptacles 41 and 42 is also mounted on the board 9. The connector 40 may be made of any suitable insulating plastic material.

Each of the triple junction solar cells 30 can be considered as a battery, the cathode of each of the diodes 14 being connected to the positive terminal of the associated battery, and the anode of each of the diodes being connected to the negative terminal of the associated battery. Thus, when one of the solar cells 30 becomes damaged or shadowed, the associated diode 14 is biased forwardly, so that a bypass current flows only through that diode. In this way, the non-damaged or non-shadowed solar cells continue to be effective to generate electricity from the solar energy received by those solar cells.

Figure 5:
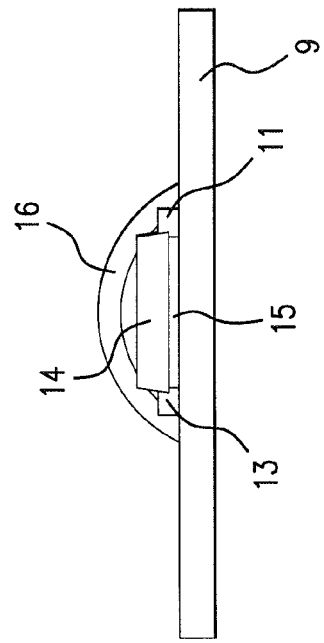
FIG. 5 is a cross-section taken on line A-A of FIG. 3.
Figure 3:
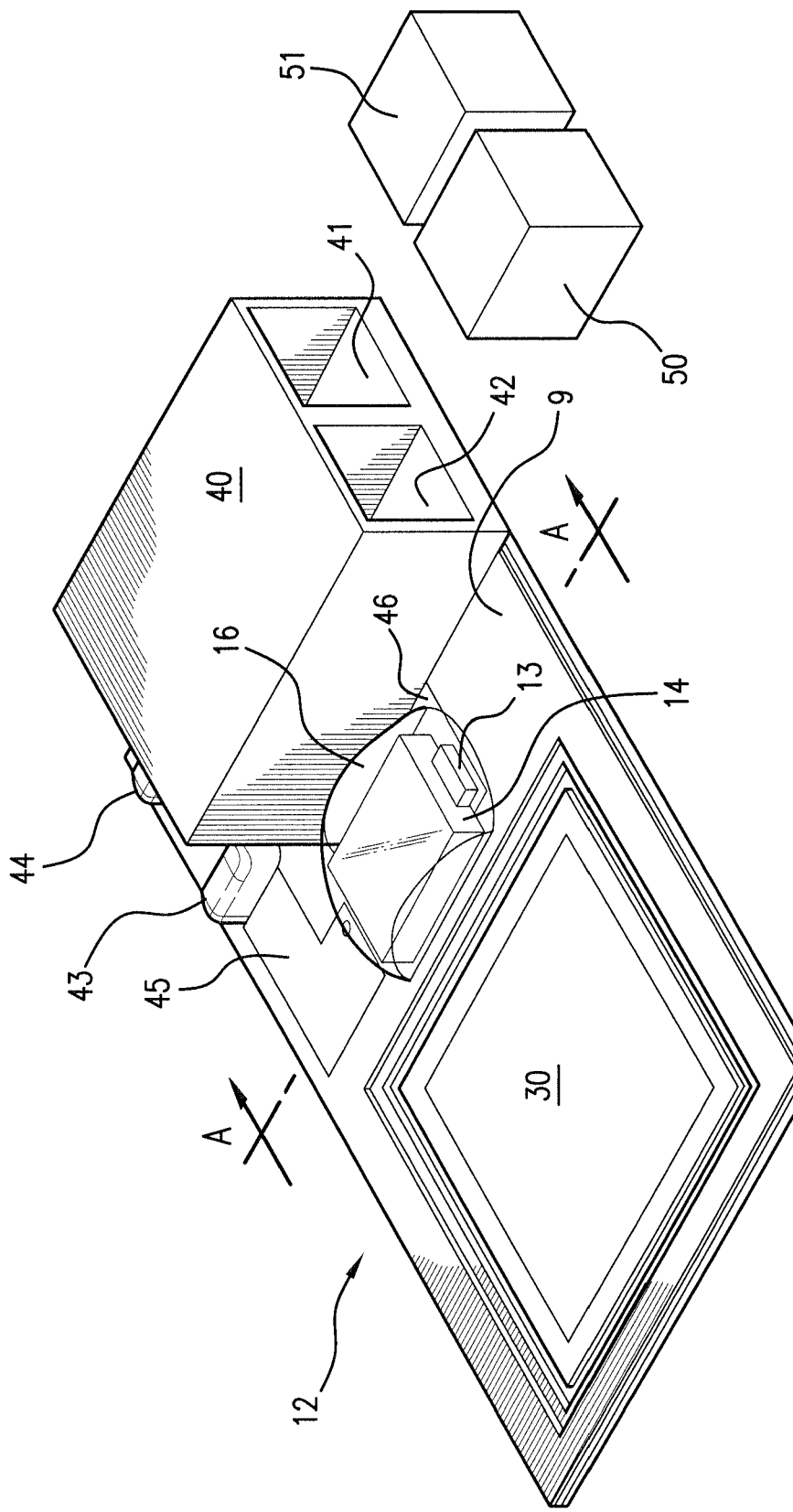
FIG. 3 is a perspective view of a board forming part solar cell module of FIG. 2.

FIGS. 3 and 5 illustrate one of the receivers 12. All the other receivers are the same, and so will not be described in detail. Thus, FIG. 3 shows one solar cell 30 and its associated diode 14. The solar cell 30 is electrically connected to the diode 14 by electrical contacts (not shown) inside the board 9. The diode 14 is electrically connected to the connector terminals 43 and 44 which, in turn, are electrically connected to sockets (not shown in FIGS. 3 and 5) mounted in the apertures 41 and 42. The sockets correspond to anode and cathode terminals, and are designed to accept receptacle plugs 50 and 51 for connection to the adjacent receivers 12 as described above with reference to FIG. 4.

In one embodiment, the relatively large connector 40, which defines insulated apertures 40a and 40b, helps prevent a solar cell breakdown as a result of electric discharges at the terminals leading to adjacent receivers. This may be a result of the insulated apertures providing an excellent insulation for each of the plug/socket electrical connections housed therein.

The diode 14 has a first terminal 11 electrically connected to the terminal 43 by a conductor trace 45, and a second terminal 13 electrically connected to the terminal 44 by a conductor trace 46.

As shown best in FIG. 5, the diode 14 is mounted above the board 9 on the terminals 11 and 13. The gap between the diode 14 and the board 9 is occupied by any suitable dielectric underfill material 15, so that there is no air gap between the diode and the board. Similarly, any suitable dielectric globtop (or conformal coating) material 16 is deposited over the diode 14 so that the diode is totally encapsulated. As the dielectric material 15 and 16 has a much higher dielectric strength than air, the risk of dielectric medium breakdown is substantially eliminated.

The underfill and globtop dielectric materials 15 and 16 prevent uncontrolled discharge of electricity, and so protect the solar cells 30 of the system. The underfill and globtop dielectric materials 15 and 16 have a higher thermal conductivity than air. Consequently, they improve heat dissipation from the components of the system to the surrounding ambient atmosphere by increasing the cross-section of the thermal path.

Another advantage of the underfill and globtop dielectric materials 15 and 16 is that moisture is prevented from condensing on the terminals of the diode 14 or on the conductor traces 45 and 46, thereby reducing the probability of short circuits during operation.

The underfill and dielectric globtop (or conformal coating) materials 15 and 16 also prevent foreign materials falling onto the terminals of the diodes 14 or onto the conductor traces 45 and 46 or onto any electrical traces on the board 9, thereby further reducing the probability of short circuits during operation.

Finally, the underfill and globtop dielectric materials 15 and 16 add mechanical integrity to the interfaces between the diodes 14 and the boards 9 to which they are attached.

It will be appreciated, by people familiar with the art of semiconductor packaging, that the principle of the present invention can be applied to terminals, leads, traces and conductors of semiconductor components on substrates, carriers, packages, daughter boards, mother boards, and panels used in solar power systems. The present invention can be applied to all types of semiconductors including, but not limited to, bare die, through hole, BGA, PGA, LGA and flip chip devices.

It will be apparent that modifications could be made to the apparatus described above. In particular, the dielectric material could be applied not only to the diodes, but also to all terminals, leads, and conductor traces on the panel. Moreover, the present invention can be used to apply a dielectric coating to any form of conductors and substrates used in solar power systems.

The invention claimed is:

1. A semiconductor solar cell receiver for use in a concentrating photovoltaic system comprising
   a support;
   a III-V compound semiconductor solar cell die mounted on the support, the solar cell die including a light-receiving surface;
   a connector mounted on the support away from the light-receiving surface, wherein the connector includes a first receiving section facing away from the light-receiving surface of the solar cell die and adapted for receiving a first electrical conductor to connect to adjacent receivers, the connector having inner and exterior surfaces, wherein the inner surfaces define an interior region of the connector; and
   a diode mounted on the support, wherein the diode is disposed outside of the interior region of the connector, is spaced away from the exterior surfaces of the connector and is spaced away from the light-receiving surface;
   the diode being connected in parallel with the solar cell die and normally being reverse biased during operation of the solar cell die while generating electrical current;
   the diode being forward biased and operative to provide a conductive path for bypassing the solar cell die when the solar cell die is shadowed or damaged;
   the connector and the solar cell die each being mounted on a same side of the support,
   a first substantially flat, planar conductive path in direct contact with a surface of the support, the first conductive path being directly connected to a first terminal of the bypass diode having a first polarity, and the first conductive path electrically coupling a first terminal of the III-V compound semiconductor multifunction solar cell die and the first terminal of the bypass diode to a first terminal for the connector; and
   a second substantially flat, planar conductive path in direct contact with the surface of the support, the second conductive path being directly connected to a second terminal of the bypass diode having a second polarity, and the second conductive path electrically coupling a second terminal of the III-V compound semiconductor multi-junction solar cell die and the second terminal of the bypass diode to a second terminal for the connector.

2. A semiconductor solar cell receiver as claimed in claim 1, wherein the connector includes a first socket with the first receiving section, and the first electrical conductor is adapted for insertion in the first socket for electrically connecting the receiver to the adjacent receivers, and adapted to carry 10 watts of power at 1000 volts.

3. A semiconductor solar cell receiver as claimed in claim 1, wherein the support is made from an insulating material, the diode being disposed on the support with a first dielectric material interposed between the support and a side of the diode facing the support and a second dielectric material encapsulating the diode.

4. A semiconductor solar cell receiver as claimed in claim 1, wherein the support is made of an insulating plastic material.

5. A semiconductor solar cell receiver as claimed in claim 1, wherein the diode is a Schottky diode.

6. A semiconductor solar cell receiver as claimed in claim 1, wherein the solar cell die is a triple junction solar cell die.

7. A semiconductor solar cell receiver as claimed in claim 1, wherein the connector includes a second receiving section facing away from the light-receiving surface of the solar cell die and adapted for receiving a second electrical conductor.

8. A semiconductor solar cell receiver as claimed in claim 2, wherein the connector includes a second socket with a second receiving section adapted for receiving a second electrical conductor, the second socket being insulated from the first socket and adapted to carry 10 watts of power at 1000 volts.

9. A semiconductor solar cell receiver as claimed in claim 8, wherein the first socket is electrically connected to an anode terminal of the diode by a first conductive trace that extends across a surface of the support and the second socket is electrically connected to a cathode terminal of the diode by a second conductive trace that extends across the surface of the support.

10. A semiconductor solar cell receiver as claimed in claim 1, wherein a bottom surface of the connector is substantially flush with the support.

11. A semiconductor solar cell device, comprising:
a board having a first side and an opposing second side;
a solar cell die mounted on the first side of the board, the solar cell die having a light receiving surface, and anode and cathode terminals;
a bypass diode mounted on the first side of the board, the bypass diode having a body, an anode contact and a cathode contact, the bypass diode being electrically connected to the solar cell with the anode contact of the bypass diode connected to the cathode terminal of the solar cell die and the cathode contact of the bypass diode connected to the anode terminal of the solar cell die, the bypass diode is normally reverse biased during operation of the solar cell die while generating electrical current and forward biased to provide a conductive path for bypassing the solar cell die when the solar cell die is shadowed or damaged;
a first connection terminal mounted on the board;
a second connection terminal mounted on the board;
a housing having a first aperture to receive a first plug for electrically connecting to the first connection terminal and to an adjacent receiver, the housing having inner and exterior surfaces, wherein the inner surfaces define an interior region of the housing, and wherein the bypass diode is disposed outside the housing and is spaced away from the exterior surfaces of the housing;
a first substantially flat, planar conductive trace in direct contact with a surface of the board and directly connected to the anode contact of the bypass diode and electrically coupling the anode contact of the bypass diode to the first connection terminal; and
a second substantially flat, planar conductive trace in direct contact with the surface of the board and directly connected to the cathode contact of the bypass diode and electrically coupling the cathode contact of the bypass diode to the second connection terminal.

12. A semiconductor solar cell device as claimed in claim 11, wherein the housing is insulative.

13. A semiconductor solar cell device as claimed in claim 12, wherein the insulative housing is mounted on the first side of the board.

14. A semiconductor solar cell device as claimed in claim 12, wherein the insulative housing has a first aperture shaped to receive a first plug for electrically connecting to the first connection terminal and a second aperture shaped to receive a second plug for electrically connecting to the second connection terminal.

15. A semiconductor solar cell device as claimed in claim 11, wherein the first and second connection terminals are mounted on the same side of the board.

16. A semiconductor solar cell receiver, comprising:
a support with a first side and a second side;
a bypass diode mounted above the first side of the support and having an anode terminal and a cathode terminal and a body region interposed between the anode and cathode terminals, with a gap between the body region and the first side of the support;
a dielectric underfill positioned in the gap between the body region of the bypass diode and the first side of the support to prevent an air gap between the body region and the first side;
a III-V compound semiconductor multijunction solar cell die mounted on the first side of the support, the III-V compound semiconductor multijunction solar cell die having an anode terminal electrically connected to the cathode terminal of the bypass diode and a cathode terminal electrically connected to the anode terminal of the bypass diode;
a connector mounted on the first side of the support, the connector including a first socket mounted in a receiving section shaped to receive a first conductor and a second socket mounted in a receiving section shaped to receive a second conductor, the connector having inner and exterior surfaces, wherein the inner surfaces define an interior region of the connector, and wherein the bypass diode is disposed outside of the interior region of the connector and is spaced away from the exterior surfaces of the connector;
a first substantially flat, planar conductive path in direct contact with a surface of the first side of the support, wherein the first conductive path is directly connected to the cathode terminal of the bypass diode and electrically connects the anode terminal of the III-V compound semiconductor multijunction solar cell die and the cathode terminal of the bypass diode to the first socket; and
a second substantially flat, planar conductive path in direct contact with the surface of the first side of the support, wherein the second conductive path is directly connected to the anode terminal of the bypass diode and electrically connects the cathode terminal of the III-V compound semiconductor multijunction solar cell die and the anode terminal of the bypass diode to the second socket.

17. A semiconductor solar cell receiver as claimed in claim 16, wherein the first and second conductive paths are on the same side of the support as the bypass diode and the connector.

18. A semiconductor solar cell receiver as claimed in claim 16, wherein the first socket includes a rectangular shape.

19. A semiconductor solar cell receiver as claimed in claim 16, further comprising a dielectric material deposited over and encapsulating the bypass diode.

20. A semiconductor solar cell receiver as claimed in claim 11, further comprising a first dielectric material positioned between the bypass diode and the first side of the board and a second dielectric material deposited over and encapsulating the bypass diode.

21. An apparatus for use in a concentrating photovoltaic system comprising:
  a semiconductor solar cell receiver comprising:
    a support;
    a III-V compound semiconductor solar cell die mounted on the support, the solar cell die including a light-receiving surface;
    a connector mounted on the support away from the light-receiving surface, the connector including a receiving section facing away from the light-receiving surface of the solar cell die and adapted for receiving an electrical conductor to connect to adjacent receivers, the connector further having inner and exterior surfaces, wherein the inner surfaces define an interior region of the connector; and
    a bypass diode mounted on the support, wherein the bypass diode is disposed outside of the interior region of the connector, is spaced away from the exterior surfaces of the connector and is spaced away from the light-receiving surface, wherein the bypass diode is connected in parallel with the solar cell die and is normally being reverse biased during operation of the solar cell die while generating electrical current, and wherein the bypass diode is forward biased and is operative to provide a conductive path for bypassing the solar cell die when the solar cell die is shadowed or damaged;
    a first substantially flat, planar conductive path in direct contact with a surface of the support, the first conductive path being directly connected to a cathode terminal of the bypass diode and electrically coupling an anode terminal of the III-V compound semiconductor multijunction solar cell die and the cathode terminal of the bypass diode to a first terminal of the connector; and
    a second substantially flat, planar conductive path in direct contact with the surface of the support, the second conductive path being directly connected to an anode terminal of the bypass diode and electrically coupling a cathode terminal of the III-V compound semiconductor multijunction solar cell die and the anode terminal of the bypass diode to a second terminal of the connector; and
  a concentrator lens to focus solar energy onto the light receiving surface of the solar cell die;
  the connector and the solar cell die each being mounted on a same side of the support.

* * * * *

UNITED STATES PATENT AND TRADEMARK OFFICE
CERTIFICATE OF CORRECTION

PATENT NO.         : 8,148,628 B2
APPLICATION NO.    : 11/830576
DATED              : April 3, 2012
INVENTOR(S)        : Lu Fang Page 1 of 1

It is certified that error appears in the above-identified patent and that said Letters Patent is hereby corrected as shown below:

Col. 4, claim 1, line 57, "multifunction" should read --multijunction--;

Col. 5, claim 6, line 19, "triple junction" should be --triple-junction--.

Signed and Sealed this
Thirtieth Day of October, 2012

David J. Kappos
*Director of the United States Patent and Trademark Office*